United States Patent
Choi et al.

(10) Patent No.: US 10,411,077 B2
(45) Date of Patent: Sep. 10, 2019

(54) DISPLAY DEVICE HAVING A COLOR FILTER

(71) Applicant: LG Display Co., Ltd., Seoul (KR)

(72) Inventors: Ho-Won Choi, Paju-si (KR); Eui-Doo Do, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/851,437

(22) Filed: Dec. 21, 2017

(65) Prior Publication Data

US 2018/0182815 A1 Jun. 28, 2018

(30) Foreign Application Priority Data

Dec. 22, 2016 (KR) .................. 10-2016-0176499

(51) Int. Cl.
| | | |
|---|---|---|
| *H01L 27/32* | (2006.01) | |
| *G02B 5/20* | (2006.01) | |
| *H01L 51/52* | (2006.01) | |

(52) U.S. Cl.
CPC ............ *H01L 27/322* (2013.01); *G02B 5/201* (2013.01); *H01L 27/3258* (2013.01); *H01L 27/3211* (2013.01); *H01L 51/5231* (2013.01); *H01L 2251/5307* (2013.01)

(58) Field of Classification Search
CPC ........................ H01L 27/322; H01L 27/3258
See application file for complete search history.

(56) References Cited

U.S. PATENT DOCUMENTS

| | | | | |
|---|---|---|---|---|
| 9,062,852 | B2 * | 6/2015 | Kim ........................ | F21V 9/08 |
| 9,583,548 | B2 * | 2/2017 | Park ................... | H01L 27/3272 |
| 2004/0207321 | A1* | 10/2004 | Nishikawa ........... | H01L 27/322 313/506 |
| 2005/0248929 | A1* | 11/2005 | Kawamura .......... | H01L 27/322 362/84 |
| 2007/0075627 | A1* | 4/2007 | Kimura ............... | H01L 27/3213 313/503 |
| 2007/0222368 | A1* | 9/2007 | Lee ..................... | H01L 27/3244 313/503 |
| 2007/0222375 | A1* | 9/2007 | Liu ....................... | H01L 27/322 313/506 |
| 2010/0117531 | A1* | 5/2010 | Park .................... | H01L 51/5246 313/512 |
| 2011/0108845 | A1* | 5/2011 | Kwon .................. | H01L 27/322 257/72 |
| 2012/0161141 | A1* | 6/2012 | Jeon ..................... | H01L 27/322 257/59 |
| 2012/0223979 | A1* | 9/2012 | Matsukura ............. | G02B 5/223 345/690 |
| 2014/0167005 | A1* | 6/2014 | Kim .................... | H01L 27/322 257/40 |

(Continued)

*Primary Examiner* — Michele Fan
(74) *Attorney, Agent, or Firm* — Birch, Stewart, Kolasch & Birch, LLP

(57) ABSTRACT

A display device can include a lower substrate; a light-emitting structure including a lower electrode, a light-emitting layer, and an upper electrode, in which the lower electrode, the light-emitting layer and the upper electrode are sequentially stacked; a color filter disposed between the lower substrate and the light-emitting structure; and an over-coat layer surrounding a side surface of the color filter, in which an upper surface of the color filter facing the light-emitting structure is coplanar with an upper surface of the over-coat layer.

20 Claims, 8 Drawing Sheets

(56) References Cited

U.S. PATENT DOCUMENTS

| | | | |
|---|---|---|---|
| 2015/0187989 A1* | 7/2015 | Sato | H01L 27/3244 257/98 |
| 2015/0249097 A1* | 9/2015 | Qi | G02F 1/136227 438/666 |
| 2016/0170260 A1* | 6/2016 | Wachi | G02B 5/201 359/741 |
| 2017/0194382 A1* | 7/2017 | Lee | H01L 27/3213 |
| 2017/0271429 A1* | 9/2017 | Kim | H01L 27/322 |
| 2018/0004017 A1* | 1/2018 | Hatsumi | G02F 1/0045 |
| 2018/0061905 A1* | 3/2018 | Choi | G09G 3/3233 |

* cited by examiner

DISPLAY DEVICE HAVING A COLOR FILTER

CROSS REFERENCE TO THE RELATED APPLICATIONS

This application claims the priority benefit of Korean Patent Application No. 10-2016-0176499, filed in the Republic of Korea on Dec. 22, 2016, which is hereby incorporated by reference as if fully set forth herein.

BACKGROUND OF THE INVENTION

Field of the Invention

The present invention relates to a display device having a color filter in order to realize different colors of adjacent pixel areas.

Discussion of the Related Art

Generally, an electronic appliance, such as a monitor, a TV, a laptop computer, and a digital camera, include a display device to realize an image. For example, the display device may include a liquid crystal display device and an organic light-emitting display device.

The display device may include emitting areas. Adjacent emitting areas may realize different colors from each other. For example, the display device includes a red emitting area displaying red color, a blue emitting area displaying blue color, a green emitting area displaying green color and a white emitting area displaying white color.

In the display device, each of the emitting areas may include a color filter. For example, a light-emitting structure and a color filter overlapping with the light-emitting structure may be disposed on each emitting area. The light-emitting structures on the adjacent emitting areas may generate the light displaying the same color. For example, the light-emitting structure including a white light-emitting layer may be disposed on each emitting area. In the display device, the color filter is not disposed on the white emitting area.

The color filter may be disposed close to a substrate in which the light generated by the light-emitting structure is emitted. For example, the color filter may be disposed between the lower substrate and the light-emitting structure. At least one insulating layer may be disposed between the color filter and the light-emitting structure. For example, the display device may include an over-coat layer between the color filter and the light-emitting structure.

However, in the display device, since the light generated by the light-emitting structure many enter into an adjacent emitting area and illuminate the wrong color filter due to a space between the light-emitting structure and its corresponding color filter, light leakage may occur. The light incident on the adjacent emitting area may be emitted to the outside after passing through the color filter on the adjacent emitting area. That is, in the display device, light leakage may cause an unintended emitting area to emit light. Thus, in the display device, the quality of the image may be decreased due to the light leakage.

SUMMARY OF THE INVENTION

Accordingly, the present invention is directed to a display device having a color filter that substantially obviates one or more problems due to limitations and disadvantages of the related art.

An object of the present invention is to provide a display device capable of preventing light leakage.

Another object of the present invention is to provide a display device in which the light generated by the light-emitting structure on each pixel area does not illuminate a color of an adjacent pixel area.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a display device including a light-emitting structure on a lower substrate. The light-emitting structure includes a lower electrode, a light-emitting layer and an upper electrode, which are sequentially stacked. A color filter is disposed between the lower substrate and the light-emitting structure. A side surface of the color filter is surrounded by an over-coat layer. An upper surface of the color filter facing the light-emitting structure is coplanar with an upper surface of the over-coat layer opposite to the lower substrate.

An edge of the lower electrode may be covered by a bank insulating layer. A horizontal distance of the upper surface of the color filter may be longer than a horizontal distance of a portion of the lower electrode exposed by the bank insulating layer.

A vertical distance of the color filter may be different from the maximum vertical distance of the over-coat layer.

The over-coat layer may include an over penetrating hole. The over penetrating hole of the over-coat layer may be filled by the color filter.

A vertical depth of the over penetrating hole may be the same as the maximum vertical distance of the over-coat layer.

A thin film transistor may be disposed between the lower substrate and the over-coat layer. A lower passivation layer may be disposed between the thin film transistor and the over-coat layer. The lower passivation layer may include a lower penetrating hole. The lower penetrating hole of the lower passivation layer may be filled by the color filter.

A side surface of the color filter contacting with the over-coat layer may be disposed at the outside of the lower penetrating hole.

A buffer layer may be disposed between the lower substrate and the thin film transistor. The buffer layer may include a buffer penetrating hole overlapping with the lower penetrating hole. The color filter may extend to the inside of the buffer penetrating hole.

The side surface of the color filter contacting with the over-coat layer may be positively tapered.

In addition, a display device includes a first color filter on a first pixel area of a lower substrate. An over-coat layer is disposed on the lower substrate. The over-coat layer surrounds a side surface of the first color filter. A first light-emitting structure is disposed on the first color filter and the over-coat layer. A lower surface of the first light-emitting structure facing the lower substrate is in direct contact with the first color filter.

The lower surface of the first light-emitting structure may be coplanar with an upper surface of the over-coat layer facing the first light-emitting structure.

A second color filter may be disposed on a second pixel area of the lower substrate spaced apart from the first pixel area. The second color filter may include a material different from the first color filter. A second light-emitting structure may be disposed on an upper surface of the second color filter opposite to the lower substrate. A vertical distance of the second color filter may be different from a vertical distance of the first color filter.

An upper surface of the second color filter facing the second light-emitting structure may be coplanar with an upper surface of the first color filter facing the first light-emitting structure.

The vertical distance of the first color filter may be the same as the maximum vertical distance of the over-coat layer.

The over-coat layer may extend between the lower substrate and the second color filter.

Each of the first color filter and the second color filter may include a side surface contacting with the over-coat layer. The side surface of the second color filter contacting with the over-coat layer may be the same shape as the side surface of the first color filter contacting with the over-coat layer.

The side surface of the first color filter may be a reverse taper.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EMBODIMENTS

Figure 1A:
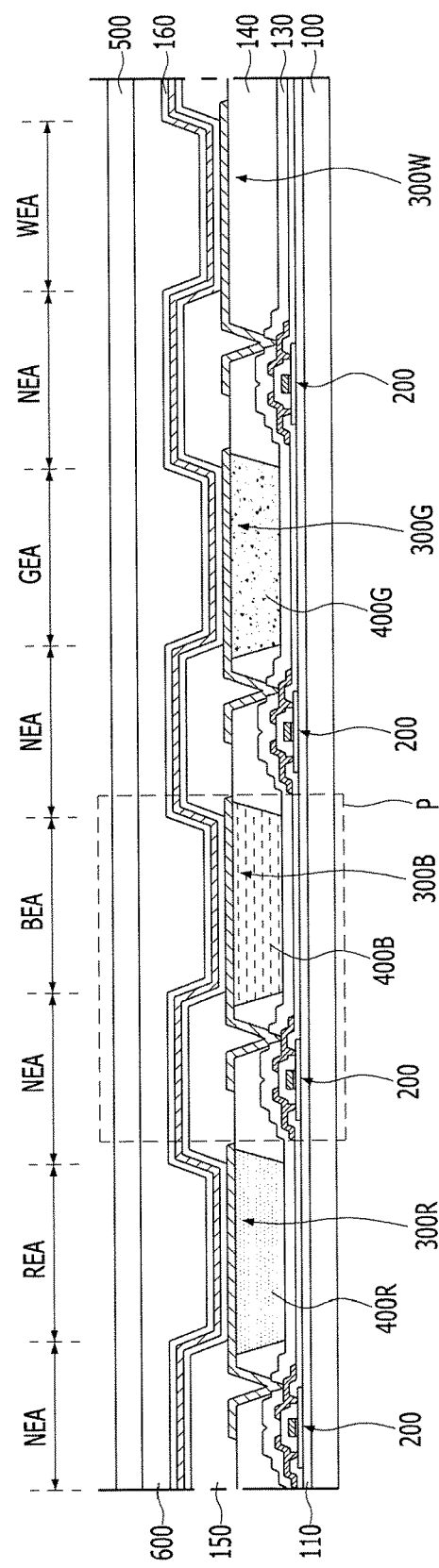
FIG. 1A is a view schematically showing a display device according to an embodiment of the present invention.

Hereinafter, details related to the above objects, technical configurations, and operational effects of the embodiments of the present invention will be clearly understood by the following detailed description with reference to the drawings, which illustrate some embodiments of the present invention. Here, the embodiments of the present invention are provided in order to allow the technical sprit of the present invention to be satisfactorily transferred to those skilled in the art, and thus the present invention may be embodied in other forms and is not limited to the embodiments described below.

In addition, the same or extremely similar elements may be designated by the same reference numerals throughout the specification, and in the drawings, the lengths and thickness of layers and regions may be exaggerated for convenience. It will be understood that, when a first element is referred to as being "on" a second element, although the first element may be disposed on the second element so as to come into contact with the second element, a third element may be interposed between the first element and the second element.

Here, terms such as, for example, "first" and "second" may be used to distinguish any one element from another element. However, the first element and the second element may be arbitrary named according to the convenience of those skilled in the art without departing the technical sprit of the present invention.

The terms used in the specification of the present invention are merely used in order to describe particular embodiments, and are not intended to limit the scope of the present invention. For example, an element described in the singular form is intended to include a plurality of elements unless the context clearly indicates otherwise. In addition, in the specification of the present invention, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations. Further, the term "may" includes all the meanings of the term "can."

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Figure 1B:
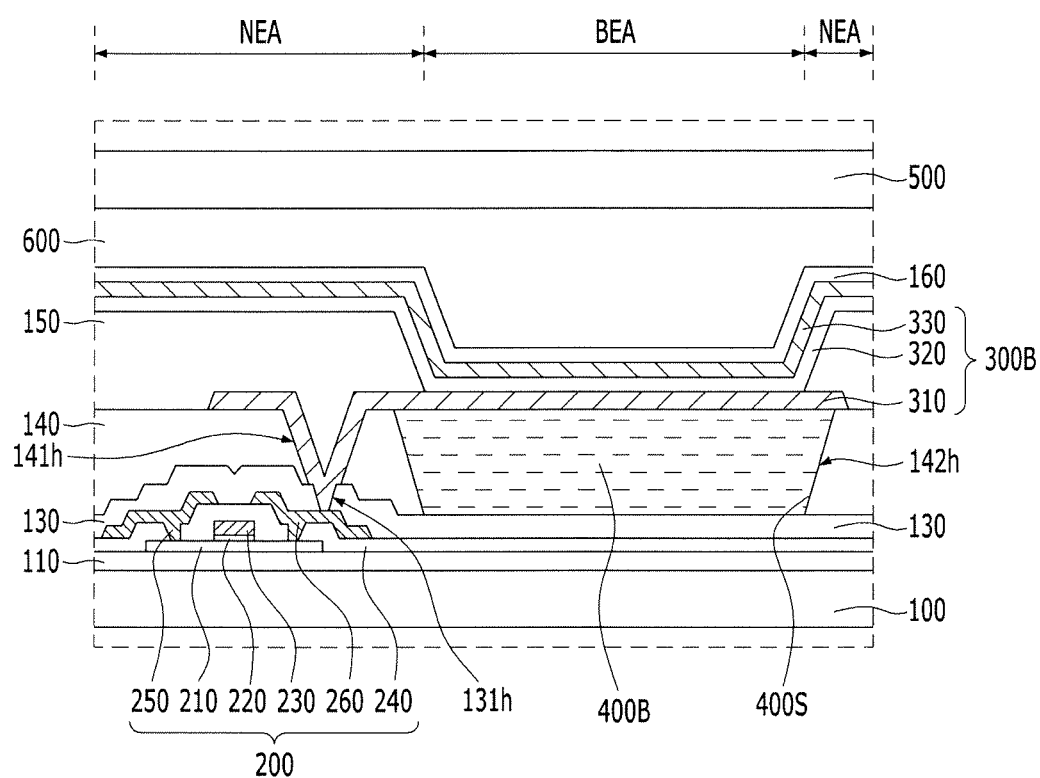
FIG. 1B is an enlarged view of a region P in FIG. 1A.

FIG. 1A is a view schematically showing a display device according to an embodiment of the present invention. FIG. 1B is an enlarged view of a region P in FIG. 1A. All the components of the display device according to all embodiments of the present invention are operatively coupled and configured.

Referring to FIGS. 1A and 1B, the display device, according to an embodiment of the present invention, can include a lower substrate 100, thin film transistors 200, light-emitting structures 300R, 300B, 300G and 300W, and color filters 400R, 400B and 400G.

The lower substrate 100 may support the thin film transistors 200, the light-emitting structures 300R, 300B, 300G and 300W, and the color filters 400R, 400B and 400G. The lower substrate 100 may include an insulating material. The lower substrate 100 may include a transparent material. For example, the lower substrate 100 may include glass or plastic.

The lower substrate 100 may include emitting areas REA, BEA, GEA and WEA and non-emitting areas NEA. The non-emitting areas NEA may be disposed between the emitting areas REA, BEA, GEA and WEA. The emitting areas REA, BEA, GEA and WEA may be separated by the non-emitting areas NEA.

The adjacent emitting areas REA, BEA, GEA and WEA may display different colors from each other. For example, the lower substrate 100 may include a red emitting area REA displaying red color, a blue emitting area BEA displaying blue color, a green emitting area GEA displaying green color and a white emitting area WEA displaying white color.

The thin film transistors 200 may be disposed on the lower substrate 100. For example, the thin film transistors 200 may be disposed on the non-emitting area NEA of the lower substrate 100. Each of the thin film transistors 200 may include a semiconductor pattern 210, a gate insulating layer 220, a gate electrode 230, an interlayer insulating layer 240, a source electrode 250 and a drain electrode 260.

The semiconductor pattern 210 may be disposed close to the lower substrate 100. The semiconductor pattern 210 may include a semiconductor material. For example, the semiconductor pattern 210 may include amorphous silicon or polycrystalline silicon. The semiconductor pattern 210 may include an oxide semiconductor material. For example, the semiconductor pattern 210 may include IGZO.

The semiconductor pattern 210 may include a source region, a drain region and a channel region. The channel region may be disposed between the source region and the drain region. The conductivity of the channel region may be lower than the conductivities of the source region and the drain region. For example, the source region and the drain region may include a conductive impurity.

The display device, according to an embodiment of the present invention, may further include a buffer layer 110 disposed between the lower substrate 100 and the semiconductor pattern 210. The buffer layer 110 may be extended beyond the semiconductor pattern 210. For example, the buffer layer 120 may cover the entire surface of the lower substrate 100. The buffer layer 110 may include an insulating material. For example, the buffer layer 110 may include silicon oxide.

The gate insulating layer 220 may be disposed on the semiconductor pattern 210. The gate insulating layer 220 may include an insulating material. For example, the gate insulating layer 220 may include silicon oxide and/or silicon nitride. The gate insulating layer 220 may be a multi-layer structure. The gate insulating layer 220 may include a High-K material. For example, the gate insulating layer 220 may include hafnium oxide (HfO) or titanium oxide (TiO).

The gate electrode 230 may be disposed on the gate insulating layer 220. The gate electrode 230 may overlap the channel region of the semiconductor pattern 210. The gate electrode 230 may be insulated from the semiconductor pattern 210 by the gate insulating layer 220. For example, the gate insulating layer 220 may include a side surface that is vertically aligned with a side surface of the gate electrode 230. The side surface of the gate insulating layer 220 may be continuous with the side surface of the gate electrode 230 (e.g., the sides of the gate insulating layer and the gate electrode can be flush with each other).

The gate electrode 230 may include a conductive material. For example, the gate electrode 230 may include a metal, such as aluminum (Al), chrome (Cr), cupper (Cu), titanium (Ti), molybdenum (Mo) and tungsten (W). The gate electrode 230 may have a multi-layer structure.

The interlayer insulating layer 240 may be disposed on the semiconductor pattern 210 and the gate electrode 230. The interlayer insulating layer 240 can extend beyond the semiconductor pattern 210 (e.g., the interlayer insulating layer can surround the gate electrode and extend pass the outer edges of the semiconductor pattern). For example, the interlayer insulating layer 240 can be in direct contact with the buffer layer 110 outside the semiconductor pattern 210. The interlayer insulating layer 240 may include an insulating material. For example, the interlayer insulating layer 240 may include silicon oxide.

The source electrode 250 may be disposed on the interlayer insulating layer 240. The source electrode 250 may be electrically connected to the source region of the semiconductor pattern 210. For example, the interlayer insulating layer 240 may include a contact hole exposing the source region of the semiconductor pattern 210.

The source electrode 250 may include a conductive material. For example, the source electrode 250 may include metal, such as aluminum (Al), chrome (Cr), molybdenum (Mo) titanium (Ti), cupper (Cu) and tungsten (W). The source electrode 250 may have a multi-layer structure.

The drain electrode 260 may be disposed on the interlayer insulating layer 240. The drain electrode 260 may be spaced apart from the source electrode 250. The drain electrode 260 may be electrically connected to the drain region of the semiconductor pattern 210. For example, the interlayer insulating layer 240 may include a contact hole exposing the drain region of the semiconductor pattern 210.

The drain electrode 260 may include a conductive material. The drain electrode 260 may include the same material as the source electrode 250. For example, the drain electrode 260 may include metal, such as aluminum (Al), chrome (Cr), molybdenum (Mo) titanium (Ti), cupper (Cu) and tungsten (W). The drain electrode 260 may have the same structure as the source electrode 250. For example, the drain electrode 260 may have a multi-layer structure.

The display device according to an embodiment of the present invention is described that the semiconductor pattern 210 of each the thin film transistor 200 may be disposed near the lower substrate 100 (e.g., closer to the lower substrate than other parts of the TFT). However, in the display device according to another embodiment of the present invention, each of thin film transistors 200 may include the semiconductor pattern 210 disposed between the gate electrode 230 and the source/drain electrodes 250 and 260.

The over-coat layer 140 may be disposed on the thin film transistors 200. The thickness difference due to the thin film transistors 200 may be removed by the over-coat layer 140. For example, an upper surface of the over-coat layer 140 opposite to the lower substrate 100 may be flat surface (e.g., the over-coat layer can act as a planarization layer). The upper surface of the over-coat layer 140 may be parallel with a surface of the lower substrate 100.

The over-coat layer 140 may include an insulating material. For example, the over-coat layer 140 may include an organic insulating material. The over-coat layer 140 may include a curable material. For example, the over-coat layer 140 may include a thermosetting material.

The display device according to an embodiment of the present invention may further include a lower passivation layer 130 between the thin film transistors 200 and the over-coat layer 140. The lower passivation layer 130 can protect the thin film transistors 200 from external moisture and impacts. The lower passivation layer 130 may extend beyond each thin film transistor 200. For example, the lower passivation layer 130 may extend to the entire surface of the lower substrate 100 along surfaces of the thin film transistors 200. The lower passivation layer 130 may include an insulating material. For example, the lower passivation layer 130 may include silicon oxide and/or silicon nitride. The lower passivation layer 130 may have a multi-layer structure.

The light-emitting structures 300R, 300B, 300G and 300W may generate light realizing a specific color. The light-emitting structures 300R, 300B, 300G and 300W may include the same structure. For example, each of the light-emitting structures 300R, 300B, 300G and 300W may include a lower electrode 310, a light-emitting layer 320, and an upper electrode 330, which are sequentially stacked.

Each of the light-emitting structures 300R, 300B, 300G and 300W may be disposed on the corresponding emitting areas REA, BEA, GEA and WEA of the lower substrate 100. For example, the light-emitting structures 300R, 300B, 300G and 300W may include a red light-emitting structure 300R on the red emitting area REA, a blue light-emitting structure 300B on the blue emitting area BEA, a green light-emitting structure 300G on the green emitting area GEA, and a white light-emitting structure 300W on the white emitting area WEA.

The light-emitting structures 300R, 300B, 300G and 300W may be controlled by the thin film transistor 200 related to the corresponding emitting area REA, BEA, GEA and WEA. For example, the lower electrode 310 of each light-emitting structure 300R, 300B, 300G and 300W may be electrically connected to the corresponding thin film transistor 200. The light-emitting structures 300R, 300B, 300G and 300W may be disposed on or within the over-coat layer 140. For example, the over-coat layer 140 may include upper contact holes 141*h* partially exposing the drain electrode of each thin film transistor 200. The lower passivation layer 130 may include lower contact holes 131*h* overlapping with the upper contact holes 141*h*. The lower electrode 310 of each light-emitting structure 300R, 300B, 300G and 300W may extend to the inside of the corresponding lower contact hole 131*h* and the corresponding upper contact hole 141*h*.

The lower electrode 310 may include a conductive material. The lower electrode 310 may include a transparent material. For example, the lower electrode 310 may be a transparent electrode having a transparent conductive material, such as ITO and IZO.

Each of the light-emitting structure 300R, 300B, 300G and 300W may be independently driven. For example, the lower electrode 310 of each light-emitting structure 300R, 300B, 300G and 300W may be electrically insulated and spaced apart from the lower electrode 310 of the adjacent light-emitting structure 300R, 300B, 300G and 300W. For example, the display device according to an embodiment of the present invention may further include a bank insulating layer 150 between the adjacent lower electrodes 310. The bank insulating layer 150 may fill a space between the adjacent lower electrodes 310. For example, an edge of the lower electrode 310 of each light-emitting structure 300R, 300B, 300G and 300W may be covered by the bank insulating layer 150. The light-emitting layer 320 and the upper electrode 330 may be stacked on a portion of the lower electrode 310 exposed by the bank insulating layer 150. For example, in the display device according to an embodiment of the present invention, the emitting areas REA, BEA, GEA and WEA may be defined by the bank insulating layer 150. The bank insulating layer 150 may include an insulating material. For example, the bank insulating layer 150 may include an organic insulating material. The bank insulating layer 150 may include a material different from the over-coat layer 140.

The light-emitting layer 320 may generate light having luminance corresponding to a voltage difference between the lower electrode 310 and the upper electrode 320. The adjacent light-emitting structures 300R, 300B, 300G and 300W may generate the light displaying the same color. For example, each of the light-emitting structures 300R, 300B, 300G and 300W may include a white light-emitting layer 320 generating the light display white color. The light-emitting layers 320 of the adjacent light-emitting structures 300R, 300B, 300G and 300W may be connected to each other (e.g., they can share the same light emitting layer and the same upper electrode, but have different or independent lower electrodes). For example, the light-emitting layer 320 of each light-emitting structure 300R, 300B, 300G and 300W may extend onto and across the bank insulating layer 150.

The light-emitting layer 320 may include an emitting material layer (EML) having an emission material. The emission material may include an organic material, an inorganic material or a hybrid material. For example, the display device according to an embodiment of the present invention may be an organic light-emitting display device including the light-emitting layer 320 formed by the organic emission material.

The light-emitting layer 320 may have a multi-layer structure in order to increase luminous efficacy. For example, the light-emitting layer 320 may further include at least one of a hole injection layer (HIL), a hole transport layer (HTL), an electron transport layer (ETL), and an electron injection layer (EIL).

The upper electrode 330 may include a conductive material. The upper electrode 330 may include a material different from the lower electrode 310. For example, the upper electrode 330 may be a reflective electrode including a metal having high-reflectance. Thus, in the display device according to an embodiment of the present invention, the light generated by the light-emitting layer 320 of each light-emitting structure 300R, 300B, 300G and 300W may be emitted through the lower electrode 310 of the corresponding light-emitting structure 300R, 300B, 300G and 300W and the lower substrate 100. The upper electrode may have a multi-layer structure.

The upper electrodes 330 of the adjacent light-emitting structures 300R, 300B, 300G and 300W may be connected to each other. For example, the upper electrode 330 may be extended onto the bank insulating layer 150. The upper electrode 330 may extend along the light-emitting layer 320.

The color filters 400R, 400B and 400G may be disposed on a path in which the light generated by the light-emitting structures 300R, 400B and 400G is emitted. For example, the color filters 400R, 400B and 400G may be disposed between the lower substrate 100 and the light-emitting structures 300R, 300B, 300G and 300W. The color filters 400R, 400B and 400G may convert the light generated by the light-emitting structures 300R, 400B and 400G. The color filters 400R, 400B and 400G may be disposed on the corresponding emitting area REA, BEA, GEA and WEA of the lower substrate 100. The display device according to an embodiment of the present invention may not include the color filter for the color being the same as the color realized by the light which is generated by the light-emitting structure 300R, 300B, 300G and 300W. For example, the color filters 400R, 400B and 400G may include a red color filter 400R on the red emitting area REA, a blue color filter 400B on the blue emitting area BEA and a green color filter 400G on the green emitting area GEA.

Each of the color filters 400R, 400B and 400G may be disposed close to the corresponding light-emitting structure 300R, 300B, 300G and 300W. For example, a lower surface (e.g., the lower surface of the lower electrode) of the light-emitting structures 300R, 300B, 300G and 300W facing the lower substrate can be in direct contact with the corresponding color filter 400R, 400B and 400G. For example, an upper surface of each color filter 400R, 400B and 400G facing the light-emitting structures 300R, 300B, 300G and 300W may be in direct contact with the lower electrode 310 of the corresponding light-emitting structure 300R, 300B, 300G and 300W. For example, the upper surface of the color filters 400R, 400B and 400G can be coplanar with the upper surface of the over-coat layer 140.

The over-coat layer 140 can include over penetrating holes 142*h* overlapping with the light-emitting structures 300R, 300B, 300G and 300W. Each of the color filters 400R, 400B and 400G can completely fill the over penetrating hole 142*h* of the corresponding emitting area REA, BEA, GEA and WEA. The over-coat layer 140 can surround side surfaces 400S of the color filters 400R, 400B and 400G. The side surface 400S of each color filter 400R, 400B and 400G can be in direct contact with the over-coat layer 140. The over penetrating holes 142*h* can completely penetrate through the over-coat layer 140. For example, each of the over penetrating holes 142*h* can expose a portion of the lower passivation layer 130. The color filters 400R, 400B and 400G can be in direct contact with the lower passivation layer 130 within the over penetrating holes 142*h*. The over penetrating holes 142*h* of the over-coat layer 140 can be spaced apart from the thin film transistors 200. For example, a vertical depth of each over penetrating hole 142*h* can be the same as the maximum vertical distance (e.g., the height) of the over-coat layer 140. A thickness of each color filter 400R, 400B and 400G can be the same as the maximum vertical distance of the over-coat layer 140.

In the display device according to an embodiment of the present invention, each of the color filters 400R, 400B and 400G can be in direct contact with the corresponding light-emitting structure 300R, 300B, 300G and 300W, so that the light generated by the light-emitting structures 300R, 300B, 300G and 300W can proceed toward the lower substrate 100 after passing through the corresponding color filter 400R, 400B and 400G. Thus, the display device according to an embodiment of the present invention can prevent the light generated by each light-emitting structure 300R, 300B, 300G and 300W from illuminating a different color, other than their own corresponding emitting area REA, BEA, GEA and WEA. Thereby, in the display device according to an embodiment of the present invention, light leakage can be prevented.

A side surface of the over penetrating hole 142*h* can be the same shape as a side surface of the upper contact hole 141*h*. For example, the side surface 400S of the color filters 400R, 400B and 400G contacting with the over-coat layer 140 can have a reverse taper (e.g., a cross section that has an upside down trapezoid shape that narrows towards a direction of the lower substrate). The over penetrating hole 142*h* can be Ruined by the same process as the upper contact hole 141*h*. For example, a method of forming the display device according to an embodiment of the present invention can include a step of forming the over-coat layer 140 on the lower passivation layer 130, a step of forming the upper contact holes 141*h* and the over penetrating holes 142*h* in the over-coat layer 140, and a step of filling each over penetrating hole 142*h* with the corresponding color filter 400R, 400B and 400G.

A horizontal length of the upper surface of the color filters 400R, 400B and 400G can be longer than a horizontal length of a portion of the lower electrode 310 exposed by the bank insulating layer 150 (e.g., an upper surface of each color filter is longer than the lowermost surface of each lower electrode). For example, the horizontal length of the upper surface of each color filter 400R, 400B and 400G can be longer than a horizontal length of the corresponding emitting area REA, BEA, GEA and WEA. A lower surface of each color filter 400R, 400B and 400G facing the lower substrate 100 can be the same as the horizontal length of the corresponding emitting area REA, BEA, GEA and WEA. Thus, in the display device according to an embodiment of the present invention, all of the light proceeding toward the lower substrate 100 from the light-emitting structures 300R, 300B, 300G and 300W can be passed through the corresponding color filter 400R, 400B and 400G (e.g., all of the light can be funneled into or captured by the correct color filter). Therefore, in the display device according to an embodiment of the present invention, light leakage can be efficiently prevented.

The display device according to an embodiment of the present invention can further include an upper substrate 500 opposite to the lower substrate 100. For example, the upper substrate 500 can be disposed on the light-emitting structures 300R, 300B, 300G and 300W. The upper substrate 500 can include an insulating material. For example, the upper substrate 500 can include glass or plastic.

The display device according to an embodiment of the present invention can further include a filler 600 filling a space between the lower substrate 100 and the upper substrate 500. For example, the filler 600 can be disposed between the light-emitting structures 300R, 300B, 300G and 300W and the upper substrate 500. The filler 600 can protect the light-emitting structures 300R, 300B, 300G and 300W from the press applied by the upper substrate 500 and moisture permeation. The filler 600 can include an insulating material. The filler 600 can include a transparent material.

The display device according to an embodiment of the present invention can further include an upper passivation layer 160 between the light-emitting structures 300R, 300B, 300G and 300W and the filler 600. The upper passivation layer 160 can prevent the light-emitting structures 300R, 300B, 300G and 300W from being damaged by external moisture and impacts. The upper passivation layer 160 can include an insulating material. For example, the upper passivation layer 160 can have a structure in which an inorganic layer including an inorganic material and an organic layer including an organic material are stacked.

Accordingly, in the display device according to an embodiment of the present invention, the over-coat layer 140 can include over penetrating holes 142*h* overlapping with the light-emitting structures 300R, 300B, 300G and 300W, and the color filers 400R, 400B and 400G can fill the corresponding over penetrating hole 142*h*, so that each of the color filters 400R, 400B and 400G can be in direct contact with the corresponding light-emitting structure 300R, 300B, 300G and 300W. Thereby, in the display device according to an embodiment of the present invention, the degradation of the quality of the image due to light leakage can be prevented.

The display device according to an embodiment of the present invention is described that the adjacent light-emitting structures 300R, 300B, 300G and 300W generate the light displaying the same color. However, in the display device according to another embodiment of the present invention, the light-emitting layer 320 of each light-emitting structure 300R, 300B, 300G and 300W can generate light displaying different colors. For example, the display device according to another embodiment of the present invention can include the red light-emitting structure 300R having a red light-emitting layer 320 in which the light displaying red color is generated, the blue light-emitting structure 300B having a blue light-emitting layer 320 in which the light displaying blue color is generated, the green light-emitting structure 300G having a green light-emitting layer 320 in which the light displaying green color is generated, and the white light-emitting structure 300W having a white light-emitting layer 320 in which the light displaying white color is generated.

Figure 2:
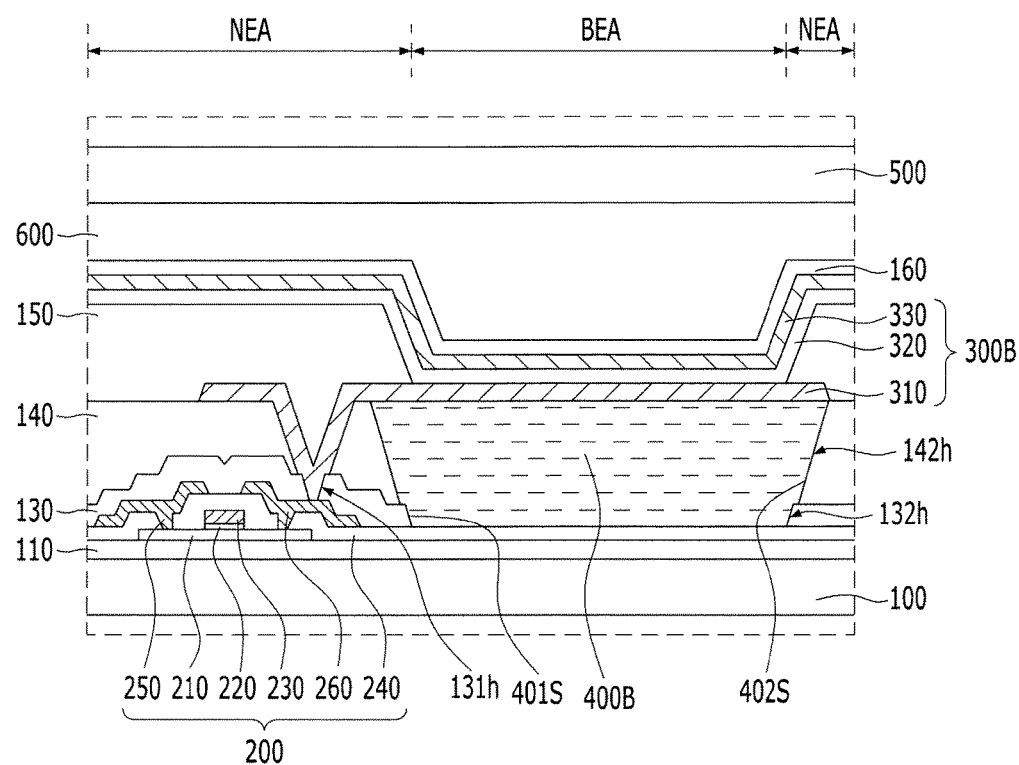
FIGS. 2 to 7 are various examples of a display device according to embodiments of the present invention.

The display device according to an embodiment of the present invention is described that the vertical distance of the color filters 400R, 400B and 400G is the same as the maximum vertical distance of the over-coat layer. However, in the display device according to another embodiment of the present invention, the color filters 400R, 400B and 400G can have the vertical distance different from the maximum vertical distance of the over-coat layer 140. For example, in the display device according to another embodiment of the present invention, the lower passivation layer 130 can include the lower penetrating hole 132h overlapping with the over penetrating hole 142h, and each of the color filter 400B can extend to the inside of the corresponding lower penetrating hole 132h, as shown in FIG. 2 (e.g., the color filter extends through the overcoat layer 140 and the lower passivation layer 130 to directly contact the interlayer insulating layer 240). Thus, in the display device according to another embodiment of the present invention, the light proceeding toward the adjacent emitting area can be prevented from illuminating color different from the corresponding emitting area.

Figure 3:
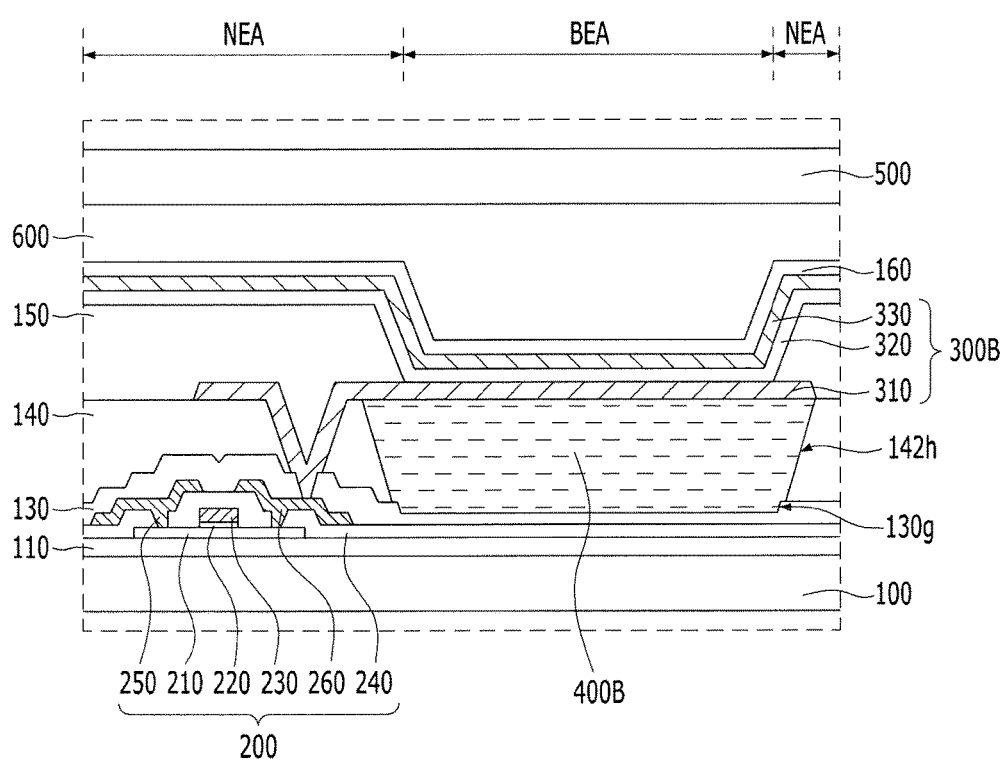

The display device according to another embodiment of the present invention is described that the lower penetrating hole 132h completely penetrating through the lower passivation layer 130 can be filled by the corresponding color filter 400B. However, in the display device according to further another embodiment of the present invention, the lower passivation layer 130 can include a lower groove 130g overlapping with the over penetrating hole 142h, the lower groove 130g can be filled by the corresponding color filter 400B, and the lower groove 130g may not completely penetrate through the lower passivation layer 130, as shown in FIG. 3. That is, in the display device according to further another embodiment of the present invention, a thin portion of the lower passivation layer 130 can extend between the lower substrate 100 and the corresponding color filter 400B.

Figure 4:
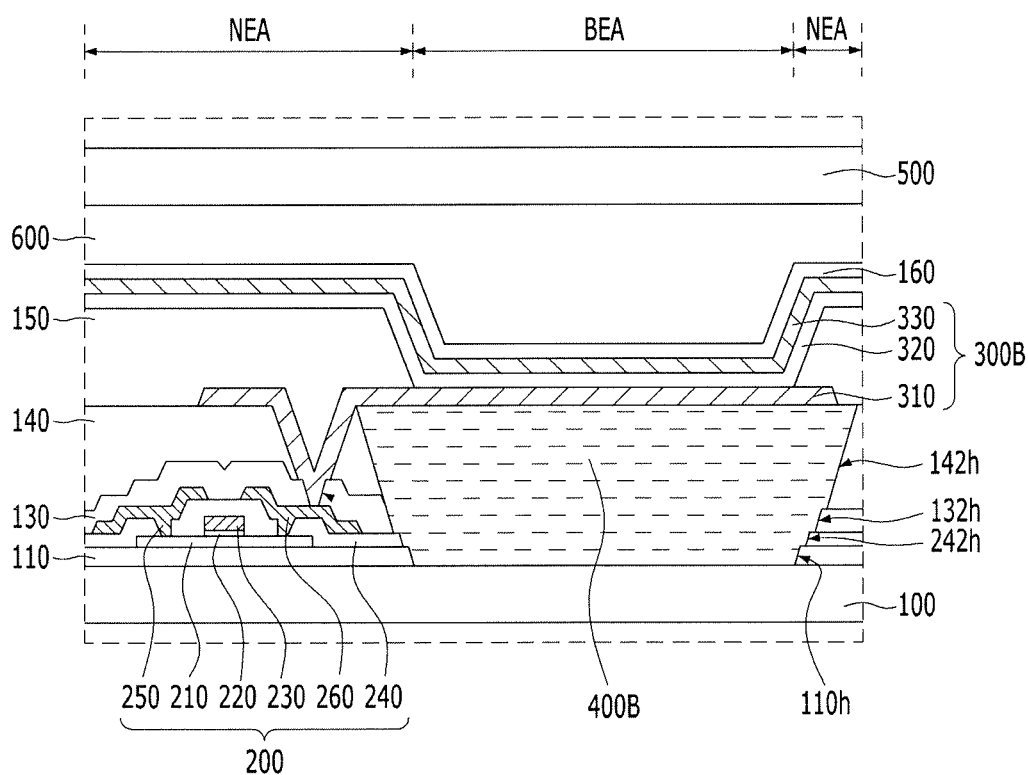

The display device according to another embodiment of the present invention is described that the color filter 400B extending to the inside of the lower penetrating hole 132h is in direct contact with an insulating layer between the lower substrate 100 and the lower passivation layer 130. However, in the display device according to further another embodiment of the present invention, the color filter 400B can be in direct contact with the lower substrate 100 within the over penetrating hole 142h. For example, in the display device according to further another embodiment of the present invention, the buffer layer 110 can include a buffer penetrating hole 110h overlapping with the over penetrating hole 142h, the interlayer insulating layer 240 can include a interlayer penetrating hole 240h between the buffer penetrating hole 110 and the over penetrating hole 142h, and the color filter 400B can extend to the inside of the buffer penetrating hole 110h and the interlayer penetrating hole 142h, as shown in FIG. 4 (e.g., the color filter extends through four holes to directly contact the lower substrate).

Figure 5:
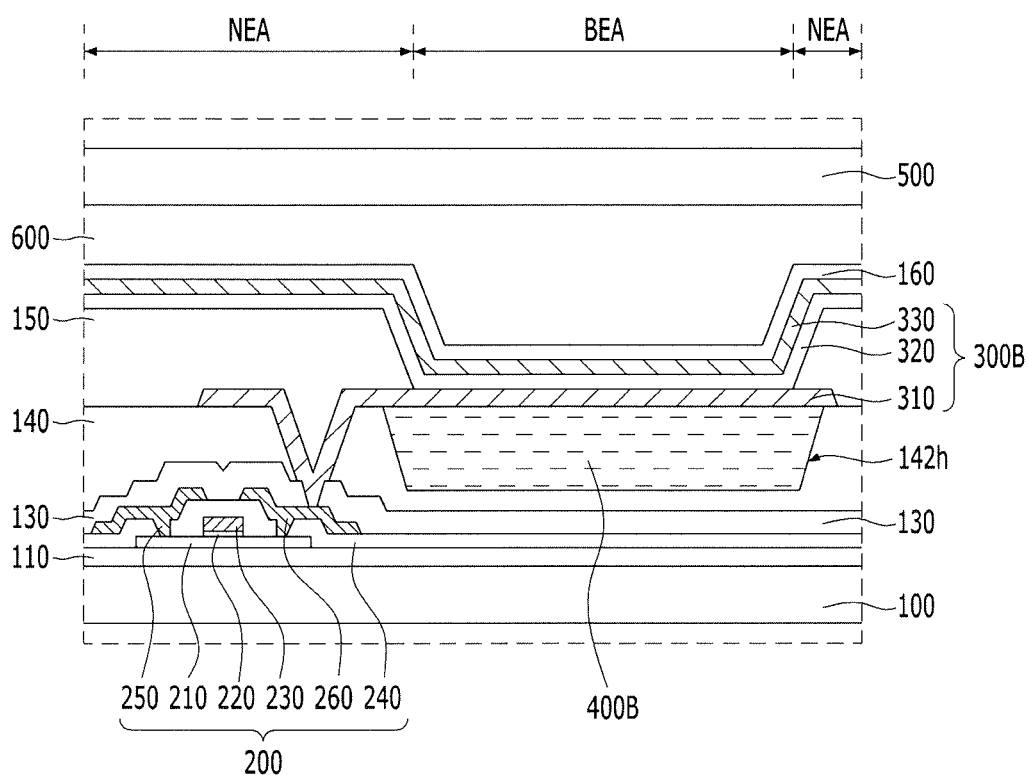

The display device according to an embodiment of the present invention is described that the vertical distance of the color filter 400B is longer than the maximum vertical distance of the over-coat layer 140. However, in the display device according to another embodiment of the present invention, the maximum vertical distance of the over-coat layer 140 is longer than the vertical distance of the color filter 400B, as shown in FIG. 5 (e.g., the color filter resides in a pocket within the over-coat layer). A thin portion of the over-coat layer 140 can extend between the lower passivation layer 130 and the color filter 400B. The lowermost surface of the color filter 400B closest to the lower substrate 100 can be in direct contact with the over-coat layer 140.

Figure 6:
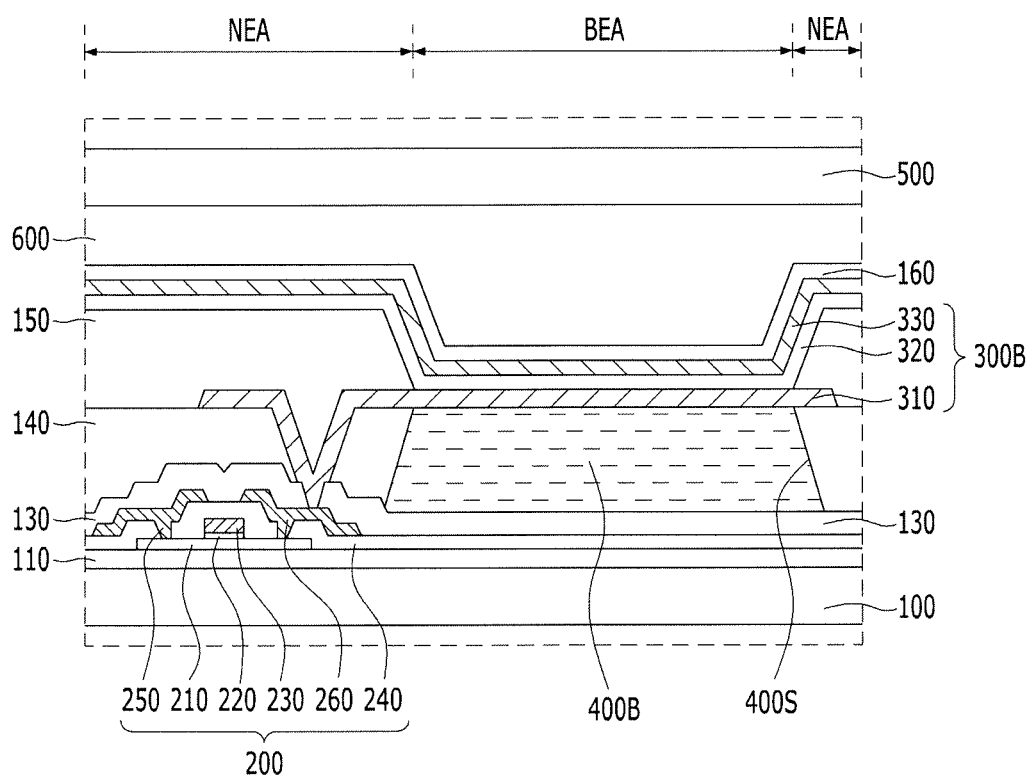

The display device according to an embodiment of the present invention is described that the side surface 400S of each color filter 400R, 400B and 400G is negatively tapered, in that a width of each color filter gets smaller in the direction toward the lower substrate, such as an upside-down trapezoid). However, in the display device according to another embodiment of the present invention, the side surface 400S of each color filter 400B can have a positive taper, as shown in FIG. 6 (e.g., a width of each color filter gets larger in the direction toward the lower substrate). For example, a method of forming the display device according to another embodiment of the present invention can include a step of forming the color filter 400B on the lower passivation layer 130, a step of forming the over-coat layer 140 surrounding the side surface of the color filter 400B, and a step of forming the upper contact holes 141h in the over-coat layer 140. Thus, in the display device according to another embodiment of the present invention, light leakage can be significantly reduced.

Figure 7:
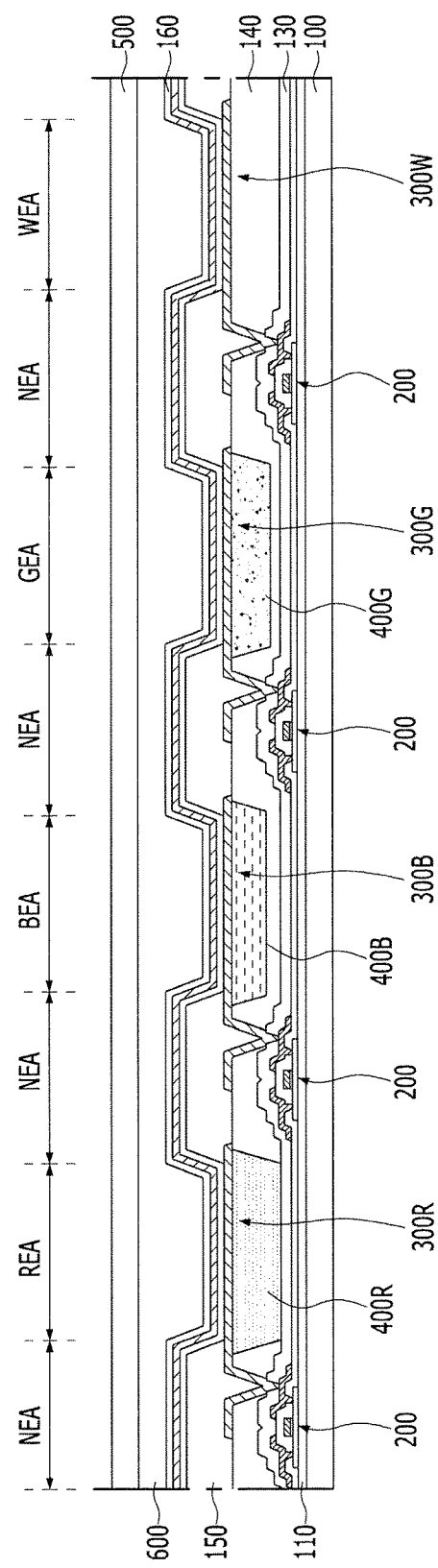

The display device according to an embodiment of the present invention is described that the color filters 400R, 400B and 400G have the same thickness. However, in the display device according to another embodiment of the present invention, the color filters 400R, 400B and 400G having different materials can have different thicknesses from each other. For example, in the display device according to another embodiment of the present invention, the thickness of the red color filter 400R can be the same as the maximum vertical distance of the over-coat layer 140, the thickness of the blue color filter 400B can be smaller than the vertical distance of the red color filter 400R, and the green color filter 400G can have a thickness between the red color filter 400R and the blue color filter 400B, as shown in FIG. 7. The upper surfaces of the color filters 400R, 400B and 400G facing the corresponding the light-emitting structure 300R, 300B, 300G and 300W can be within or on the same plane (e.g., coplanar). The lower surfaces of the color filters 400R, 400B and 400G toward the lower substrate 100 can have different levels from each other (e.g., on different planes). For example, the over-coat layer 140 can extend between the lower substrate 100 and the blue color filter 400B and between the lower substrate 100 and the green color filter 400G. The vertical distance of the over-coat layer 140 disposed between the lower substrate 100 and the green color filter 400G can be smaller than the vertical distance of the over-coat layer 140 between the lower substrate 100 and the blue color filter 400B. Thus, in the display device according to another embodiment of the present invention, the color coordinates of each emitting region REA, BEA, GEA and WEA can be adjusted by changing the vertical length of the color filters 400R, 400B and 400G as required, so that light leakage can be prevented and the color sense can be improved.

In the result, the display device according to the embodiments of the present invention can include a light-emitting structure tightly fitted against the corresponding color filter. Thus, in the display device according to the embodiments of the present invention, light leakage can be prevented. Therefore, in the display device according to the embodiments of the present invention, the quality of the displaying image can be improved.

What is claimed is:
1. A display device comprising:
   a lower substrate including emitting areas and non-emitting areas between the emitting areas;
   light-emitting structures on the emitting areas of the lower substrate, each of the light-emitting structures including:
      a lower electrode,
      a light-emitting layer, and
      an upper electrode, wherein the lower electrode, the light-emitting layer and the upper electrode are sequentially stacked;

an over-coat layer disposed between the lower substrate and the light-emitting structures, the over-coat layer including over-coat trenches overlapping with the light-emitting structures; and color filters in the over-coat trenches of the over-coat layer, wherein an upper surface of each of the color filters facing the corresponding light-emitting structure is in contact with the lower electrode of the corresponding light-emitting structure, and wherein a vertical depth of each of the over-coat trenches in a direction perpendicular to the lower substrate depends on a color realized in the corresponding emitting area.

2. The display device according to claim 1, further comprising a bank insulating layer covering an edge of each lower electrode, wherein a width of the upper surface of each of the color filters is larger than a width of a portion of the corresponding lower electrode exposed by the bank insulating layer.

3. The display device according to claim 1, wherein the vertical depth of at least one of the over-coat trenches is equal to a maximum vertical distance of the over-coat layer, and wherein the maximum vertical distance is in a direction perpendicular to the lower substrate.

4. The display device according to claim 3, wherein the upper surface of each of the color filters facing the corresponding light-emitting structure is coplanar.

5. The display device according to claim 3, further comprising:

thin film transistors disposed between the lower substrate and the over-coat layer; and a lower passivation layer disposed between the thin film transistors and the over-coat layer, wherein the lower passivation layer includes at least one lower trench filled by one of the color filters, so that a thickness of at least one of the color filters is larger than the maximum vertical distance of the over-coat layer.

6. The display device according to claim 5, wherein the at least one of the color filters extending inside of the at least one lower trench includes a side surface contacting with the over-coat layer.

7. The display device according to claim 5, further comprising a buffer layer disposed between the lower substrate and the thin film transistors, wherein the buffer layer includes at least one buffer trench overlapping with the at least one lower trench, and wherein the at least one of the color filters extends inside of the third at least one buffer trench in the buffer layer.

8. The display device according to claim 1, wherein the side surface of each of the color filters has a positive taper and a width of each of the color filters increases in a direction toward the lower substrate.

9. A display device comprising:

a lower substrate;

a first color filter disposed on a first pixel area of the lower substrate;

a second color filter disposed on a second pixel area of the lower substrate spaced apart from the first pixel area, the second color filter including a material different from the first color filter;

an over-coat layer disposed on the lower substrate and surrounding side surfaces of the first color filter and the second color filter;

a first light-emitting structure disposed on the first color filter, a lower surface of the first light-emitting structure facing the lower substrate being in contact with the first color filter; and a second light-emitting structure disposed on the second color filter, a lower surface of the second light-emitting structure facing the lower substrate being in contact with the second color filter, wherein a thickness of the second color filter is smaller than a thickness of the first color filter, and wherein a vertical distance between the lower substrate and the second color filter is larger than a vertical distance between the lower substrate and the first color filter.

10. The display device according to claim 9, wherein the lower surface of the first light-emitting structure is coplanar with the lower surface of the second light-emitting structure.

11. The display device according to claim 9, further comprising:

a third color filter disposed on a third pixel area of the lower substrate spaced apart from the first pixel area and the second pixel area, the third color filter including a material different from the first color filter and the second color filter; and a third light-emitting structure disposed on the third color filter, a lower surface of the third light-emitting structure facing the lower substrate being in contact with the third color filter, wherein a thickness of the third color filter is different from smaller than a thickness of the second color filter, and wherein a vertical distance between the lower substrate and the third color filter is larger than a vertical distance between the lower substrate and the second color filter.

12. The display device according to claim 9, wherein an upper surface of the second color filter facing the second light-emitting structure is coplanar with an upper surface of the first color filter facing the first light-emitting structure.

13. The display device according to claim 9, wherein the thickness of the first color filter is equal to a maximum vertical distance of the over-coat layer, and wherein the maximum vertical distance is in a direction perpendicular to the lower substrate.

14. The display device according to claim 13, wherein the over-coat layer extends between the lower substrate and the second color filter.

15. The display device according to claim 9, wherein the first color filter and the second color filter respectively include a side surface contacting with the over-coat layer, and wherein the side surface of the second color filter contacting with the over-coat layer has a same shape as the side surface of the first color filter contacting with the over-coat layer.

16. The display device according to claim 15, wherein the side surface of the first color filter has a negative taper and a width of the first color filter decreases in a direction toward the lower substrate.

17. A display device comprising:

a lower substrate;

a pixel including a red subpixel, a blue subpixel, a green subpixel and a white subpixel;

a plurality of thin film transistors respectively corresponding to the red, blue, green and white subpixels, wherein at least one of the plurality of thin firm transistors is disposed between two adjacent subpixels among the red, blue, green and white subpixels;

a plurality of light-emitting structures disposed in each of the red, blue, green and white subpixels, and each of the plurality of light-emitting structures including:
- a lower electrode,
- a light-emitting layer, and
- an upper electrode, wherein the lower electrode, the light-emitting layer and the upper electrode are sequentially stacked;

a red color filter, a blue color filter and a green color filter disposed in the red, blue, green subpixels, respectively; and an over-coat layer surrounding side surfaces of each of the red, blue and green color filters, wherein the lower electrode in each of the red, blue, green subpixels contacts with the upper surface of each of the red, blue and green color filters, respectively, wherein a thickness of each of the red, blue, green color filters is different from each other, and wherein a distance between the lower substrate and each of the red, blue and green color filters is inversely proportional to the thickness of each of the red, blue, green color filters.

18. The display device according to claim 17, wherein an upper surface of each of the red, blue and green color filters is coplanar with an upper surface of the over-coat layer, and wherein the upper electrodes of the plurality of light-emitting structures are coplanar.

19. The display device according to claim 17, wherein at least one of the red, blue and green color filters has a positive taper and a width that decreases in a direction away from the lower substrate.

20. The display device according to claim 17, wherein at least one of the red, blue and green color filters has a negative taper and a width that increases in a direction away from the lower substrate.

* * * * *